United States Patent
Myoung et al.

(10) Patent No.: US 9,755,190 B2
(45) Date of Patent: Sep. 5, 2017

(54) LASER-INDUCED THERMAL IMAGING APPARATUS, METHOD OF LASER-INDUCED THERMAL IMAGING, AND MANUFACTURING METHOD OF ORGANIC LIGHT-EMITTING DISPLAY APPARATUS USING THE METHOD

(71) Applicant: Samsung Display Co., Ltd., Yongin, Gyeonggi-Do (KR)

(72) Inventors: Seung-Ho Myoung, Yongin (KR); Won-Yong Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 538 days.

(21) Appl. No.: 14/052,089

(22) Filed: Oct. 11, 2013

(65) Prior Publication Data
US 2014/0308768 A1    Oct. 16, 2014

(30) Foreign Application Priority Data
Apr. 16, 2013  (KR) .................. 10-2013-0041836

(51) Int. Cl.
  *H01L 51/56*  (2006.01)
  *H01L 51/00*  (2006.01)
(52) U.S. Cl.
  CPC .......... *H01L 51/56* (2013.01); *H01L 51/0013* (2013.01)
(58) Field of Classification Search
  CPC .................................................. H01L 51/0011
  See application file for complete search history.

(56) References Cited

U.S. PATENT DOCUMENTS

| | | | |
|---|---|---|---|
| 6,982,181 B2 | 1/2006 | Hideo | |
| 7,816,649 B2 | 10/2010 | Kim et al. | |
| 2004/0177982 A1 | 9/2004 | Shibata | |
| 2004/0192070 A1 | 9/2004 | Tateishi | |
| 2005/0266591 A1 | 12/2005 | Hideo | |
| 2005/0275819 A1* | 12/2005 | Tolbert | G03B 27/16 355/67 |
| 2007/0045540 A1 | 3/2007 | Kang et al. | |

(Continued)

FOREIGN PATENT DOCUMENTS

KR   10-2009-0072757 A   7/2009
KR   10-2010-0065362 A   6/2010
(Continued)

*Primary Examiner* — Mary Wilczewski
*Assistant Examiner* — Erik T Peterson
(74) *Attorney, Agent, or Firm* — H.C. Park & Associates, PLC (57) ABSTRACT

A laser-induced thermal imaging apparatus includes a substrate support unit and a laser beam irradiation unit. The substrate support unit and the laser beam irradiation unit move relative to each other so that the substrate arranged on the substrate support unit is scanned in one direction by a laser beam irradiated from the laser beam irradiation unit. The laser beam irradiation unit includes a beam generation unit, a first mask arranged on a path of the linear laser beam generated in the beam generation unit, the first mask including a plurality of openings arranged along a length direction of the linear laser beam, and a shield unit movable to expose all of the plurality of openings of the first mask or to shield at least some of the plurality of openings of the first mask.

18 Claims, 9 Drawing Sheets

(56) References Cited

U.S. PATENT DOCUMENTS

| | | |
|---|---|---|
| 2007/0046072 A1 | 3/2007 | Kang et al. |
| 2007/0046762 A1 | 3/2007 | Kang et al. |
| 2007/0046770 A1 | 3/2007 | Noh et al. |
| 2007/0048658 A1 | 3/2007 | Kang et al. |
| 2007/0063205 A1 | 3/2007 | Kang et al. |
| 2011/0195352 A1* | 8/2011 | Kim .................. B41M 3/003 430/5 |
| 2013/0002793 A1 | 1/2013 | Kim |

FOREIGN PATENT DOCUMENTS

| | | |
|---|---|---|
| KR | 10-2012-0042521 A | 5/2012 |
| KR | 1020120042521 * | 5/2012 |
| WO | 2009047990 A1 | 4/2009 |

\* cited by examiner

LASER-INDUCED THERMAL IMAGING APPARATUS, METHOD OF LASER-INDUCED THERMAL IMAGING, AND MANUFACTURING METHOD OF ORGANIC LIGHT-EMITTING DISPLAY APPARATUS USING THE METHOD

CLAIM OF PRIORITY

This application makes reference to, incorporates into this specification the entire contents of, and claims all benefits accruing under 35 U.S.C. §119 from an application earlier filed in the Korean Intellectual Property Office on Apr. 16, 2013 and there duly assigned Serial No. 10-2013-0041836.

BACKGROUND OF THE INVENTION

Field of the Invention

The present invention relates to a laser-induced thermal imaging apparatus and method, and a method of manufacturing an organic light-emitting display apparatus using the same, and more particularly, to a laser-induced thermal imaging apparatus and method, and a method of manufacturing an organic light-emitting display apparatus using the same, by which transfer defects may be reduced.

Description of the Related Art

An organic light-emitting display apparatus has high response speeds, low power consumption, and wide view angles, which are advantages in a mobile image display apparatus. Furthermore, the organic light-emitting display apparatus may be manufactured at a low temperature based on conventional semiconductor technology, and the manufacturing method is simpler than other displays, and thus the organic light-emitting display apparatus is drawing attention as a next-generation flat-panel display.

A light-emitting layer, and other elements are interposed between a pixel electrode and a counter electrode facing the pixel electrode in the organic light-emitting display apparatus. An example of a method of patterning the light-emitting layer, and other elements is a laser-induced thermal imaging (LITI) method.

The LITI method is a method of converting a laser beam irradiated from a light source into heat energy, and forming a pattern by transferring a light-emitting layer, and other elements to a substrate using the heat energy. In order to perform the LITI method, a donor film, where a transfer layer such as a light-emitting layer to be transferred is formed, a light source, and a substrate which is a subject are needed.

In the LITI method, the donor film generally covers the entire substrate, which is a receptor, and the donor film and the substrate are fixed on a substrate support unit, such as a storage. Thereafter, a laser beam is irradiated on the donor film, and a light-emitting layer, and other elements are transferred to the substrate.

However, according to the conventional laser-induced thermal imaging method, the transfer cannot be completed in one scanning on the front surface of one substrate due to the limitation of a width or length of a laser beam, and thus a light-emitting layer, etc. are formed in a plurality of times of scanning on one substrate. At this time, after scanning a laser beam in a first area, when scanning the beam in a second area, transfer defects referred to as stitch defects may occur in a portion of the second area, which is adjacent to the first area, due to the influence of the previous laser beam scanning.

SUMMARY OF THE INVENTION

The present invention relates to a laser-induced thermal imaging apparatus and method, and a method of manufacturing an organic light-emitting display apparatus using the method, by which transfer defects may be reduced.

According to an aspect of the present invention, there is provided a laser-induced thermal imaging apparatus including: a substrate support unit on which a substrate is arranged; and a laser beam irradiation unit configured to irradiate a laser beam in a direction of the substrate arranged on the substrate support unit, the laser beam irradiation unit being placed away from the substrate arranged on the substrate support unit. The substrate support unit and the laser beam irradiation unit are configured to move relative to each other so that the substrate arranged on the substrate support unit is scanned in one direction by a laser beam irradiated from the laser beam irradiation unit. The laser beam irradiation unit includes: a beam generation unit that generates a linear laser beam; a first mask arranged on a path of the linear laser beam generated in the beam generation unit, the first mask including a plurality of openings arranged along a length direction of the linear laser beam; and a shield unit movable to expose all of the plurality of openings of the first mask or to shield at least some of the plurality of the openings of the first mask. The length direction of the linear laser beam generated in the beam generation unit is not perpendicular to the one direction.

The shield unit may be movable along the length direction of the linear laser beam generated in the laser beam generation unit.

The shield unit may gradually expose or shield the plurality of openings of the first mask at a constant speed when the substrate arranged on the substrate support unit is scanned in the one direction by a laser beam irradiated from the laser beam irradiation unit.

The shield unit may include a first shield plate and a second shield plate.

When the substrate arranged on the substrate support unit is scanned along the one direction from one edge to another edge by a laser beam irradiated from the laser beam irradiation unit, the first shield plate may gradually expose the plurality of openings of the first mask, and the second shield plate may gradually shield the plurality of openings of the first mask after exposing all predetermined openings among the plurality of openings of the first mask.

The second shield plate may first shield a first opening among the plurality of openings and then shield a second opening among the plurality of openings while the first shield plate exposes the first opening and then exposes the second opening.

The first shield plate and the second shield plate may be mutually connected by a support unit.

A distance between the first shield plate and the second shield plate may be greater than a distance between openings located at both ends of predetermined openings among the plurality of openings of the first mask.

The beam generation unit and the first mask may irradiate a laser beam in the direction of the substrate arranged on the substrate support unit while moving along the one direction relative to the substrate support unit.

The plurality of openings of the first mask may be dot patterns.

The plurality of openings of the first mask may include a pair of first sides parallel to the one direction and a pair of second sides parallel to the length direction of the linear laser beam generated in the beam generation unit.

According to another aspect of the present invention, there is provided a laser-induced thermal imaging apparatus including: a substrate support unit on which a substrate having an active area is arranged; a laser beam irradiation unit configured to irradiate a laser beam in a direction of the substrate arranged on the substrate support unit, the laser beam irradiation unit being placed away from the substrate arranged on the substrate support unit; and a second mask including a transmission unit corresponding to the active area of the substrate arranged on the substrate support unit, the second mask being arranged on a path of the laser beam irradiated from the laser beam irradiation unit. The substrate support unit and the laser beam irradiation unit are configured to relatively move so that the substrate arranged on the substrate support unit is scanned in one direction by a laser beam irradiated from the laser beam irradiation unit. The laser beam irradiation unit includes: a beam generation unit that generates a linear laser beam; and a first mask arranged on a path of the linear laser beam generated in the beam generation unit, the first mask including a plurality of openings arranged along a length direction of the linear laser beam. The length direction of the linear laser beam generated in the beam generation unit is not perpendicular to the one direction.

The active area of the substrate arranged on the substrate support unit may include a plurality of separately spaced areas, and the transmission unit of the second mask may include a plurality of separately spaced transmission areas corresponding to the plurality of areas included in the active area of the substrate arranged on the substrate support unit.

The laser-induced thermal imaging apparatus may further include a film-fixing frame that fixes a donor film including a transfer layer to be transferred on the substrate arranged on the substrate support unit, wherein the second mask is placed adjacent to the donor film if the donor film is placed adjacent to the substrate arranged on the substrate support unit by the film-fixing frame.

The beam generation unit and the first mask may irradiate a laser beam in the direction of the substrate arranged on the substrate support unit while moving along the one direction relative to the substrate support unit.

The plurality of openings of the first mask may be dot patterns.

The plurality of openings of the first mask may include a pair of first sides parallel to the one direction and a pair of second sides parallel to the length direction of the linear laser beam generated in the beam generation unit.

According to another aspect of the present invention, there is provided a laser-induced thermal imaging method including: positioning a substrate on a substrate support unit; positioning a donor film on the substrate; irradiating a linear laser beam on the donor film after the linear laser beam passes through a first mask including a plurality of openings arranged along a length direction of the laser beam; and transferring a transfer layer of the donor film on the substrate in a linear pattern extended in the one direction by scanning the substrate by the laser beam in the one direction that is not perpendicular to the length direction of the laser beam. The transferring exposes all of the plurality of openings of the first mask or shields at least some of the plurality of openings of the first mask.

The transferring may gradually expose or shield the plurality of openings of the first mask.

The transferring may include: gradually exposing the plurality of openings of the first mask with a first shield plate for the transfer; and gradually shielding the plurality of openings of the first mask with a second shield plate after exposing predetermined openings among the plurality of openings of the first mask.

A first opening among the plurality of openings of the first mask may be exposed by the first shield plate and then a second opening among the plurality of openings of the first mask is exposed by the first shield plate, and the first opening is shielded by the second plate and then the second opening is shielded by the second shield plate.

According to another aspect of the present invention, there is provided a laser-induced thermal imaging method including: transferring a substrate including an active area on a substrate support unit; positioning a donor film on the substrate; irradiating a linear laser beam on a donor film after the linear laser beam passes through a second mask including a transmission unit corresponding to the active area of the substrate after passing through a first mask including a plurality of openings arranged along a length direction of the laser beam; and transferring a transfer layer of the donor film on the substrate in a linear pattern extended in one direction that is not perpendicular to the length direction of the laser beam by scanning the substrate by the laser beam in the one direction.

According to another aspect of the present invention, there is provided a method of manufacturing an organic light-emitting display apparatus to form an organic film interposed between a pixel electrode and a counter electrode of an organic light-emitting device by using the above laser-induced thermal imaging method.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Expressions such as "at least one of," when preceding a list of elements, modify the entire list of elements and do not modify the individual elements of the list.

Hereinafter, the embodiments of the present invention will be described in detail with reference to the attached drawings. However, the present invention is not limited to the embodiments disclosed below, and may be implemented in other various forms. The embodiments described below complete the disclosure of the present invention, and are provided to inform those skilled in the art of the scope of the invention. Furthermore, the sizes of the components illustrated in the drawings may be exaggerated for the convenience of description. For example, the size and thickness of each component shown in the drawings is arbitrarily shown, and thus the present invention is not limited thereto.

In the embodiments described below, the x-axis, y-axis, and z-axis are not limited to three axes on rectangular coordinates, and may include a broad meaning including the three axes. For example, the x-axis, y-axis, and z-axis may be at right angles to each other, but may also indicate other directions which are not at right angles to each other.

Furthermore, in the case where a position relationship between two items are described with the terms "on ~", "on the top of ~", or the like, one or more items may be interposed therebetween unless a description is given with the term "directly."

Figure 3:
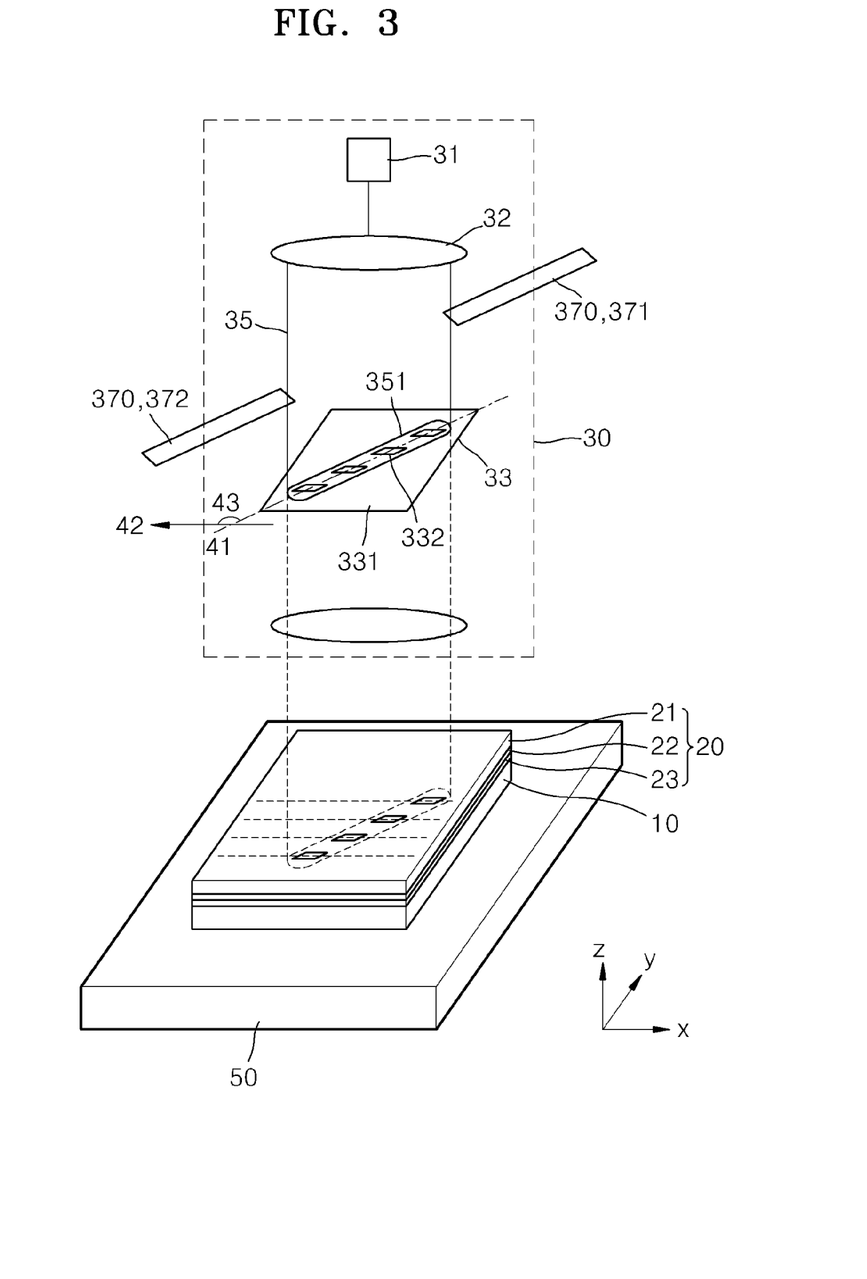
Figure 4:
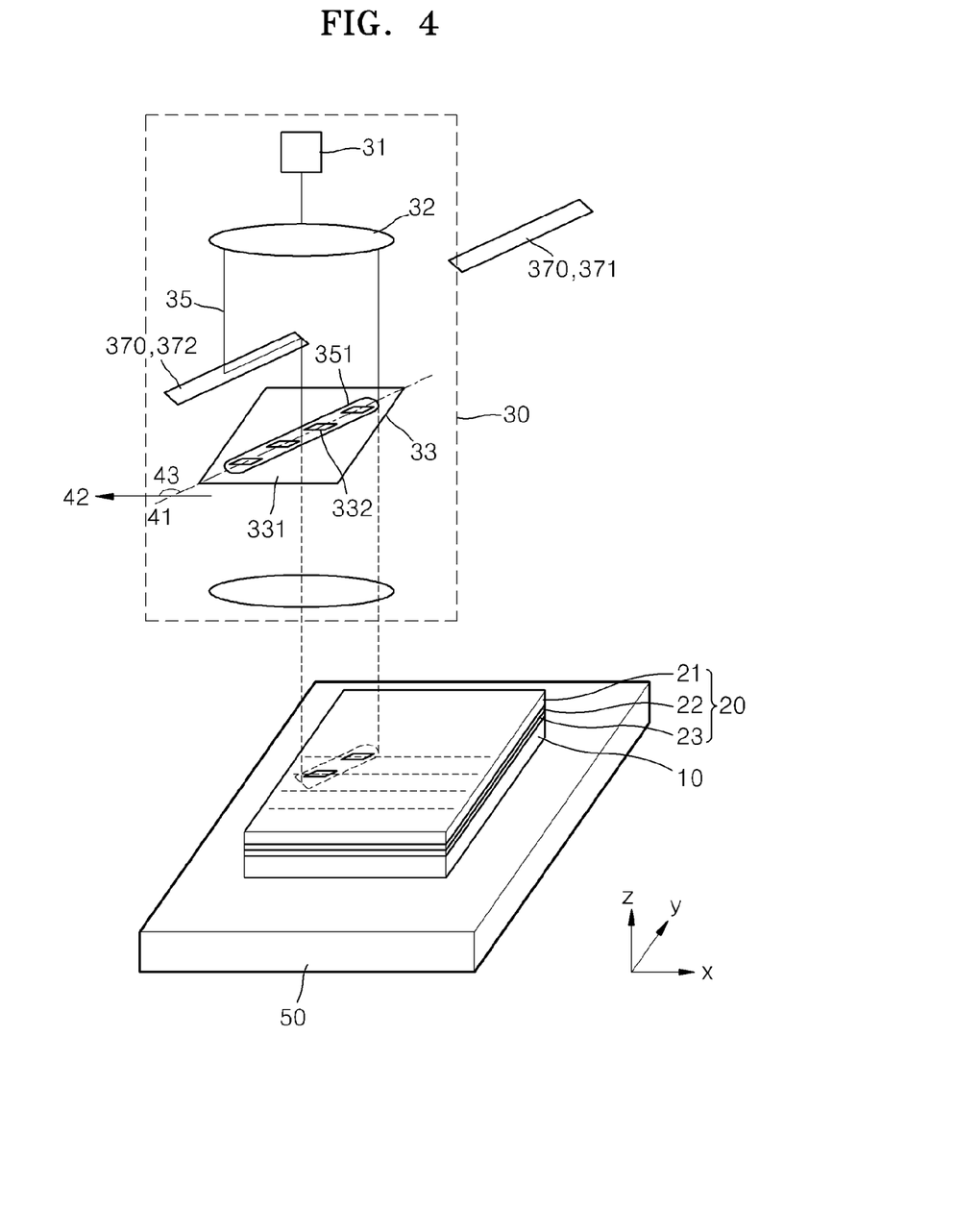
Figure 5:
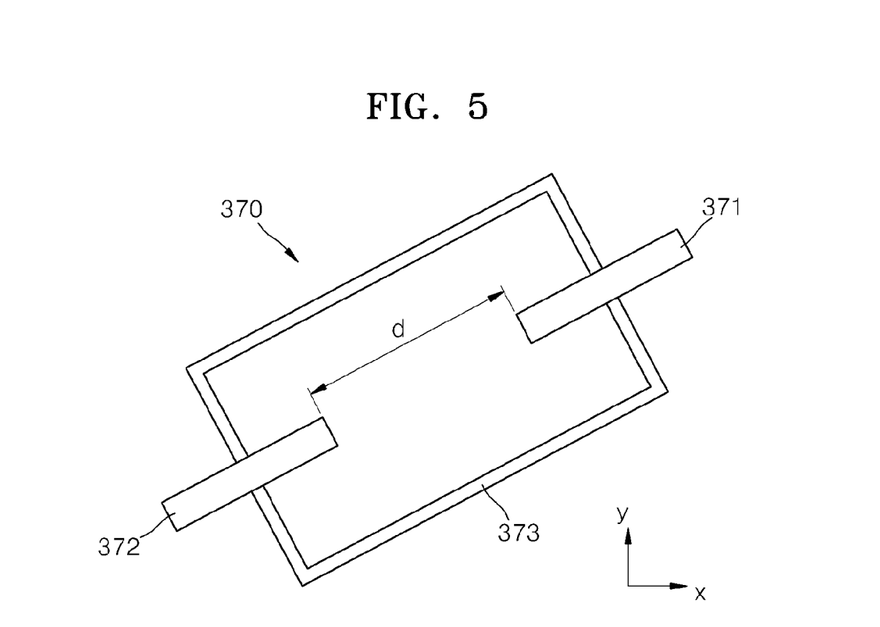
FIG. 5 is a planar view schematically illustrating a part of a laser-induced thermal imaging apparatus according to another embodiment of the present invention.
Figure 6:
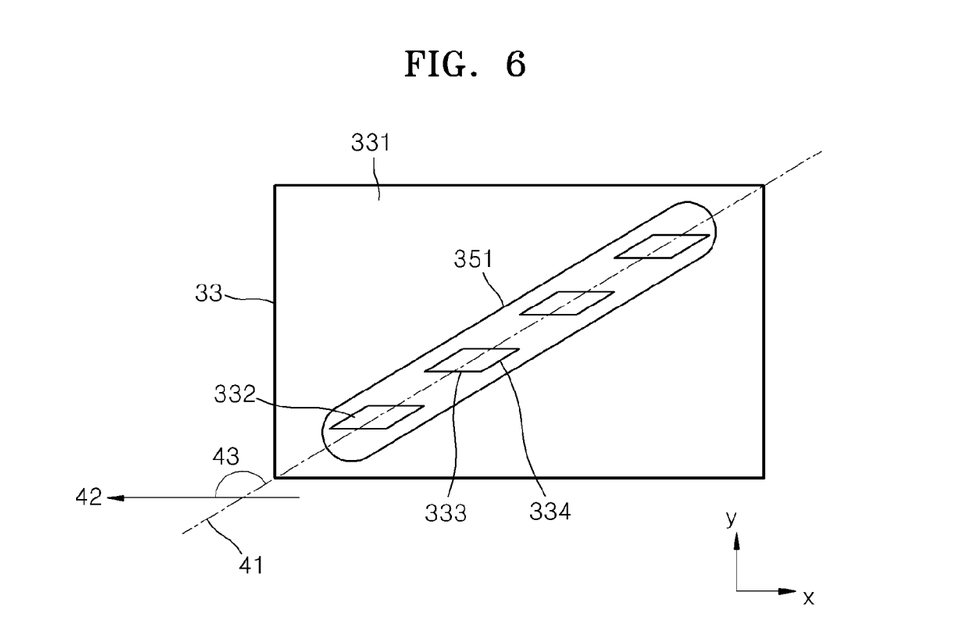
FIG. 6 is a planar view schematically illustrating a part of the laser-induced thermal imaging apparatus according to another embodiment of the present invention.

FIGS. 1 to 4 are views schematically illustrating a configuration and operation of a laser-induced thermal imaging apparatus according to an embodiment of the present invention, FIG. 5 is a planar view schematically illustrating a part of a laser-induced thermal imaging apparatus according to another embodiment of the present invention, and FIG. 6 is a planar view schematically illustrating a part of the laser-induced thermal imaging apparatus according to another embodiment of the present invention.

The laser-induced thermal imaging apparatus according to an embodiment of the present invention includes a substrate support unit 50 and a laser beam irradiation unit 30 placed away from a substrate 10 disposed on the substrate support unit 50.

The substrate 10 may be placed on the substrate support unit 50, and the substrate support unit 50 may itself move or be moved. When the substrate support unit 50 itself is moved, the substrate support unit 50 may be understood as a stage.

A donor film 20 is disposed on the substrate 10. The donor film 20 includes a transfer layer 23 that contacts the substrate 10 or is placed adjacent to the substrate 10, a base film 21 facing the transfer layer 23, and a photothermal conversion layer 22 placed between the transfer layer 23 and the base film 21. As a laser beam 35 is irradiated on the base film 21 of the donor film 20, the photothermal conversion layer 22 converts light energy into thermal energy so as to transfer the transfer layer 23 onto the substrate 10.

The laser beam irradiation unit 30 includes a laser beam oscillator 31 that oscillates a laser beam, a first mask 33 placed on a path of a laser beam generated in the laser beam oscillator 31, and a movable shield unit 370. Furthermore, the laser beam irradiation unit 30 may also include a first optical system 32 and a second optical system 34, as illustrated in FIGS. 1 to 4.

A YAG laser device, an excimer laser device, or the like may be used as the laser beam oscillator 31. The shape of the laser beam oscillated in the laser beam oscillator 31 may become linear as the laser beam passes through the first optical system 32. FIGS. 1 to 4 illustrate a laser beam that is linearized in a direction between the x-axis and y-axis. Here, the combination of the laser beam oscillator 31 and the first optical system 32 may be understood as a beam generation unit that generates a linear laser beam 35. The configuration of the beam generation unit that generates the linear laser beam 35 is not limited to the configuration that includes the laser beam oscillator 31 and the first optical system 32, and may be variously modified. The first optical system 32 may homogenize the laser beam.

The second optical system 34 is used to set a focus of the laser beam 35. The second optical system 34 may reverse the passing laser beam 35, unlike as described with reference to FIGS. 1 to 4. The laser beam irradiation unit 30 may further include various mirrors and optical systems although not illustrated in FIGS. 1 to 4.

The first mask 33 is placed on a path of the linear laser beam 35 generated in the beam generation unit. For example, the first mask 33 may be interposed between the first optical system 32 and the second optical system 34. Also, the location of the first mask 33 may be changed so that the laser beam 35 may reach the first mask 33 after passing through the second optical system 34. Likewise, the first mask 33 is disposed on the path of the laser beam 35 and partly transmits and partly blocks the laser beam 35.

Specifically, the first mask 33 has a structure where openings 332 are formed in a block unit 331. The openings 332 are arranged as dot patterns, and the array direction of the openings 332 coincides with the length direction of a linear shape 351 of the laser beam 35 irradiated on the first mask 33.

The shield unit 370 may be movable so that all of the openings 332 of the first mask 33 may be exposed or at least some of the openings 332 may be shielded. That is, the shield unit 370 may be movable relative to the first mask 33. The function and role of the shield unit 370 are described below.

Here, the substrate support unit 50 and the laser beam irradiation unit 30 may move relative to each other so that the substrate 10 disposed on the substrate support unit 50 may be scanned in one direction by a laser beam irradiated by the laser beam irradiation unit 30. Here, the substrate 10 disposed on the substrate support unit 50 being scanned in one direction by a laser beam irradiated by the laser beam irradiation unit 30 may be understood as the donor film 20 on the substrate 10 disposed on the substrate support unit 50 being scanned in one direction by a laser beam irradiated from the laser beam irradiation unit 30.

The relative movement of the substrate support unit 50 and the laser beam irradiation unit 30 may be irradiating a laser beam toward the donor film 20 while the laser beam irradiation unit 30 moves in one direction—scanning direction 42 (−x direction)—when the location of the substrate support unit 50 is fixed, as illustrated in FIGS. 1 to 4. Alternatively, the location of the laser beam irradiation unit 30 may be fixed and the substrate support unit 50, where the substrate 10 is disposed, may move, and thus the laser beam may be irradiated on the substrate 10, i.e., the donor film 20, so as to be scanned. Hereinafter, a case where the laser beam irradiation unit 30 moves will be described for the convenience of description. For reference, the laser beam irradiation unit 30 that moves relative to the substrate support unit 50 may be understood as the beam generation unit and the first mask 33 that moves relative to the substrate support unit 50.

Here, the length direction of the linear laser beam 35 generated in the beam generation unit, i.e., an array direction 41 of the openings 332 of the first mask 333, may not be at right angles to the one direction, the scanning direction 42 (−x direction). That is, the array direction 41 of the openings 332 of the first mask 33 may be slanted with respect to the one direction, the scanning direction 42 (−x direction). As such, the laser beam dots 352 irradiated on the donor film 20 also are slanted with respect to the one direction—the scanning direction 42 (−x direction)—as shown in FIGS. 1 to 4.

In this state, if the scanning is performed while the laser beam irradiation unit 30 moves in the one direction (the scanning direction 42 (−x direction)), the right and left sides direction (+y direction or −y direction) at right angles to the scanning direction of respective laser beam dots 352 may not be in a state where the laser beam is irradiated. As such, the thermal distribution on the donor film 20 due to the irradiation of the laser beam 35 on the donor film 20 becomes uniform so as to minimize a transfer defect due to thermal non-uniformity.

Figure 1:
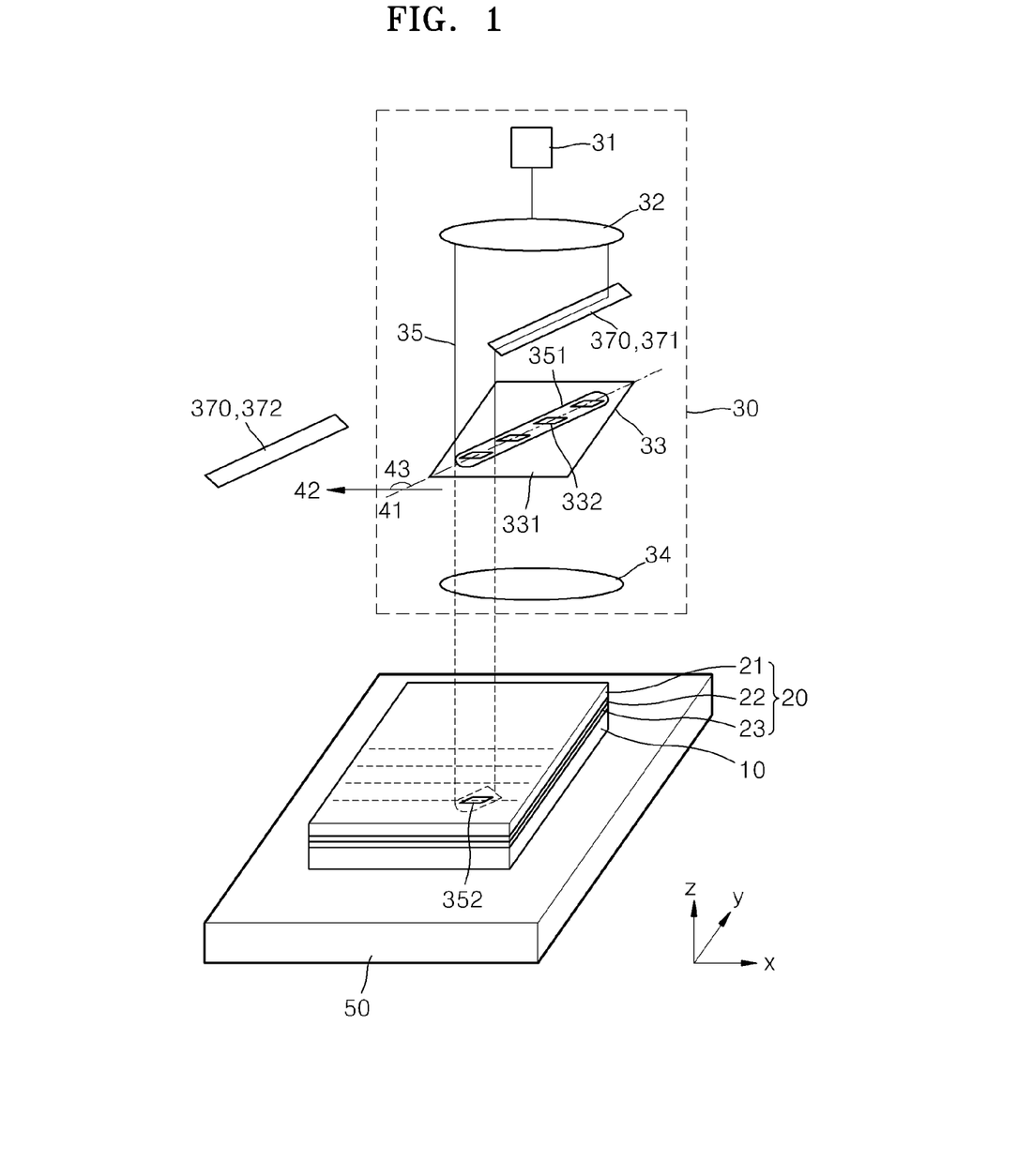
FIGS. 1 to 4 are views schematically illustrating a configuration and operation of a laser-induced thermal imaging apparatus according to an embodiment of the present invention.
Figure 2:
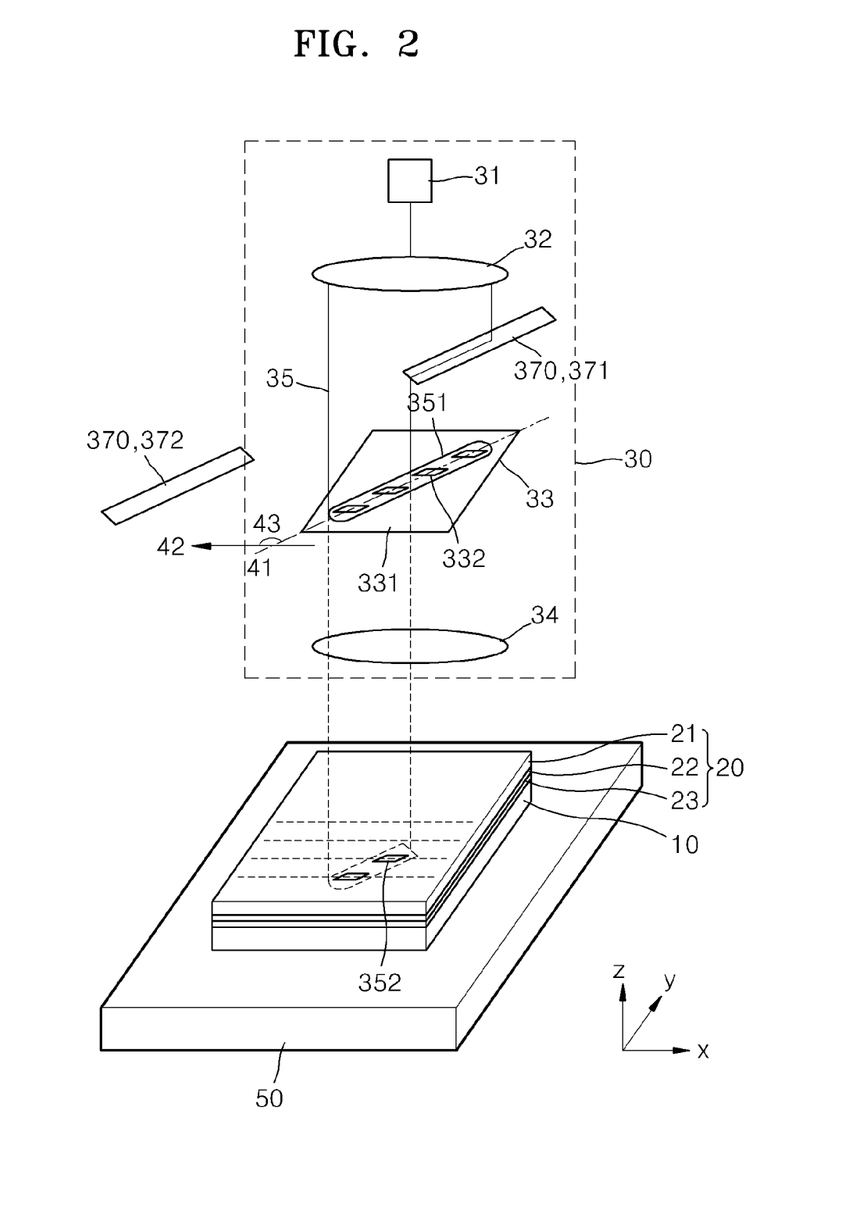

Likewise, the length direction of the linear laser beam 35 generated in the beam generation unit, i.e., the array direction 41 of the openings 332 of the first mask 33, is not at right angles to the one direction (scanning direction 42 (−x direction)), and thus if the shield unit 370 is not present when the laser beam irradiation unit 30 irradiates a laser beam in a state as illustrated in FIG. 1 or 2, the linear laser beam 35 may be inevitably irradiated on a portion (e.g., the substrate support unit 50) other than the substrate 10 or the donor film 20. Likewise, the laser beam irradiation on an unnecessary portion may cause a problem of damage or a lifespan reduction of a laser-induced thermal imaging apparatus. Furthermore, the transfer layer 23 may not be transferred from the donor film 20 to the edge part of the substrate 10, which is not the active area (i.e., the display area) of the substrate 10. However, if the shield unit 370 is not present, when the laser beam irradiation unit 30 irradiates the laser beam in a state illustrated in FIG. 1 or FIG. 2, a linear laser beam may be irradiated on the location corresponding to the edge part of the substrate 10, not the active area (i.e., the display area) of the substrate 10, so that the transfer layer 23 of the donor film 20 is transmitted to the substrate 10.

However, in the case of a laser-induced thermal transfer imaging apparatus, a shield unit 370 is provided, and thus the irradiation of the laser beam on an unnecessary part of the laser-induced thermal imaging apparatus or a transfer of the transfer layer 23 of the donor film 20 to an unnecessary part of the substrate 10 may be effectively prevented. Specifically, in a state as illustrated in FIG. 1 or 2, the shield unit 370 shields the openings 332 where the laser beam reaches a portion other than a preset portion of the substrate 10, i.e., the donor film 20 at the time of the transmission of the laser beam among the openings 332 in the first mask 33.

Such a shield unit 370 may be movable along the length direction of the linear laser beam 35 generated in the beam generation unit. As such, a plurality of openings 332 of the first mask 33, arranged in a direction that coincides with the length direction of the linear laser beam 35, may be effectively shielded or exposed.

Furthermore, the substrate 10 arranged on the substrate support unit 50 may be scanned in one direction (−x direction) by the laser beam 35 irradiated by the laser beam irradiation unit 30. Hence, in this case, the shield unit 370 may gradually expose or shield the plurality of openings 332 of the first mask 33 at a constant speed.

For example, when the substrate 10 arranged on the substrate support unit 50 is scanned in one direction (−x direction) by the laser beam 35 irradiated by the laser beam irradiation unit 30, the shield unit 370 may gradually expose the plurality of openings 332 of the first mask at a constant speed according to the scanning speed, as illustrated in FIGS. 1 and 2. Thereafter, even though the shield unit 370 exposes all of the openings 332 of the first mask 33, if all the laser beams, which have passed through all of the openings 332 of the first mask 33, are irradiated on a preset area of the substrate 10, i.e., the donor film 20, the state where the shield unit 370 exposes all of the plurality of openings 332 of the first mask is maintained, as illustrated in FIG. 3. Furthermore, only predetermined openings among the openings 332 of the first mask 33 may be exposed and the other openings may be maintained in a shielded state as necessary. In the case of FIG. 3, all of the plurality of openings 332 of the first mask 33 may be understood to have been predetermined. If the scanning further proceeds in this state, the shield unit 370 may gradually shield the plurality of openings 332 of the first mask 33 according to the scanning speed, as illustrated in FIG. 4.

Likewise, the shield unit 370 may include a first shield plate 371 and a second shield plate 372 that are located on the same plane, as illustrated in FIGS. 1 to 4. The first shield plate 371 or the second shield plate 372 may shield a progress of the laser beam, and may be formed of metal, for example, Invar, for minimizing thermal deformation.

Here, when the substrate 10 arranged on the substrate support unit 50 is scanned to the other edge (the edge parallel to the y-axis from the +x direction) along one direction (−x direction) at one edge (the edge parallel to the y-axis from the −x direction) by the laser beam 35 irradiated by the laser beam irradiation unit 30, the first shield plate 371 gradually exposes the openings 332 of the first mask 33, as illustrated in FIGS. 1 and 2. Thereafter, as the scanning proceeds, after all predetermined openings among the openings 332 of the first mask 33 are exposed as illustrated in FIG. 3, the second shield plate 372 may gradually shield the plurality of openings 332 of the first mask, as illustrated in FIG. 4. In this case, the second shield plate 372 first shields a first opening among the plurality of openings 332 of the first mask 33, and then shields a second opening among the plurality of openings 332, while the first shield plate 371 exposes the first opening and then exposes the second opening.

The first shield plate 371 and the second shield plate 372 may be independently and separately operated, or may be operated by the same driving source. In the case of being operated by the same driving source, the first shield plate 371 and the second shield plate 372 may be mutually connected by a support unit 373, as illustrated in FIG. 5.

Here, a distance d between the first shield plate 371 and the second shield plate 372 may be set to be greater than the distance between the openings 332 located at both ends of predetermined openings among the plurality of openings 332 of the first mask 33. In the cases illustrated in FIGS. 1 to 3, there may be a case where all of the plurality of openings 332 of the first mask 33 are exposed as illustrated in FIG. 3, and thus the distance d between the first shield plate 371 and the second shield plate 372 may be set to be greater than the distance between the openings 332 at both ends among the plurality of openings 332 of the first mask 33.

Furthermore, as illustrated in FIG. 6, each of the openings 332 of the first mask 33 may be formed as a quadrangle including a pair of first sides 333 parallel to the scanning direction 42 of the laser beam and a pair of second sides 334 parallel to the array direction 41 of plurality of openings 332 of the first mask 33. In this case, thermal inequality applied to the substrate 10 and the donor film 20 by the laser beam may be further prevented, and thus transfer defects may be further reduced.

That is, as the laser beam dots 352 (see FIGS. 1 to 4) irradiated on a first region of the donor film have a shape as of the plurality of openings 332 of the first mask 33, in a second region of the donor film which is adjacent to the first region in +y direction, it is possible for the second region to be irradiated by the laser beam after sufficient time since the first region is irradiated, and in a third region of the donor film which is adjacent to the first region in −y direction, it is possible for the first region to be irradiated after sufficient time since the third region is irradiated.

Figure 7:
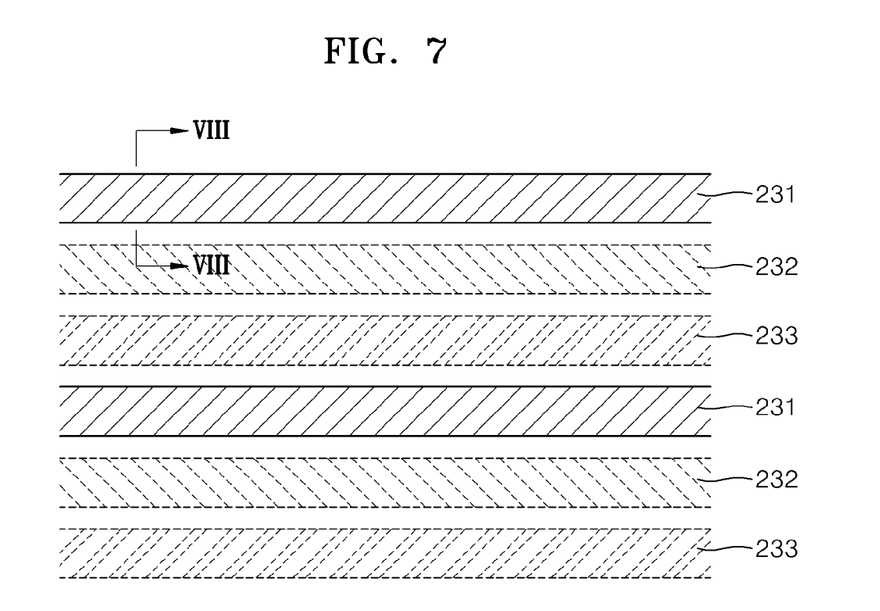
FIG. 7 is a planar view schematically illustrating an organic film pattern formed by the laser-induced thermal imaging apparatus of FIG. 1.
Figure 8:
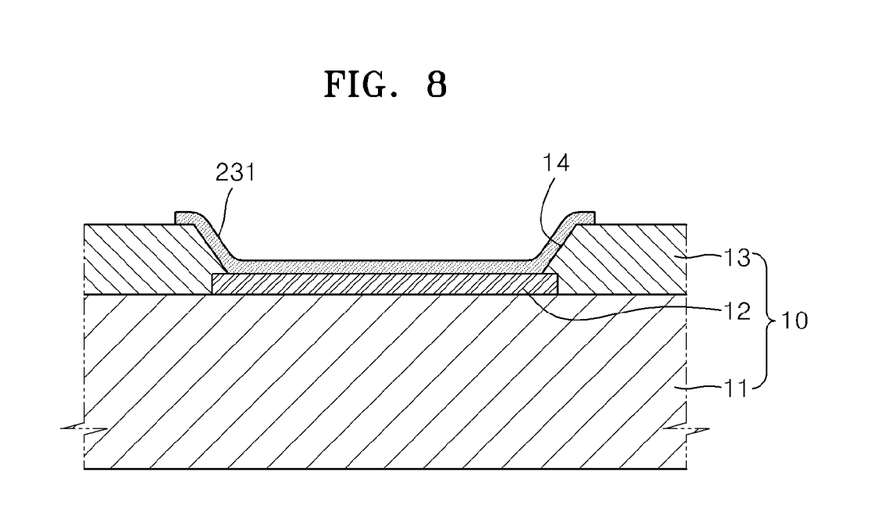
FIG. 8 is a cross-sectional view taken along line VIII-VIII of FIG. 7.

FIG. 7 is a planar view schematically illustrating an organic film pattern formed by the laser-induced thermal imaging apparatus of FIG. 1, and FIG. 8 is a cross-sectional view taken along line VIII-VIII of FIG. 7. The above-described laser-induced thermal imaging apparatus may be used in forming an organic light-emitting layer of the organic light-emitting display apparatus.

As illustrated in FIG. 8, first, a pixel electrode 12 is formed on the base substrate 11, and an insulation film 13, including an opening 14 that exposes at least a part of the pixel electrode 12, is formed on a base substrate 11. The base substrate 11 may include a pixel circuit including a thin film transistor, and the pixel circuit may be electrically connected to the pixel electrode 12.

Likewise, the donor film 20 for forming the organic light-emitting layer on the substrate 10, including the base substrate 11, the pixel electrode 12, and the insulation film 13, is mounted, and the laser beam is irradiated and scanned. Then, as illustrated in FIG. 8, the transfer layer 23 of the donor film 20 is transferred to the pixel electrode 12 so that a first organic light-emitting layer may be formed.

Although not illustrated in FIG. 8, a common layer, such as an HTL and an HIL, may be further formed between the first organic light-emitting layer 231 and the pixel electrode 12.

The first organic light-emitting layer 231 may have separately placed stripe patterns, as illustrated in FIG. 7. Furthermore, a second organic light-emitting layer 232 and a third organic light-emitting layer 233 having different colors may be formed by repeating the above-described transfer process between respective first organic light-emitting layers 231.

The first organic light-emitting layer 231 to the third organic light-emitting layer may emit light of different wavelengths, and may be organic light-emitting layers, for example, red light, green light, and blue light, respectively.

According to the above-described present invention, when a patterned organic light-emitting layer is formed as illustrated in FIGS. 7 and 8, even if the transfer of the organic light-emitting layer is completed by a plurality of times of scanning on a single substrate area, the thermal state due to the laser beam may become the same so that thermal equilibrium is made, and thus the generation of a transfer defect may be restricted. Furthermore, the irradiation of the laser beam on an unnecessary portion of the laser-induced thermal imaging apparatus or the transfer of a transfer layer of a donor film on an unnecessary portion of a substrate may be effectively prevented.

Figure 9:
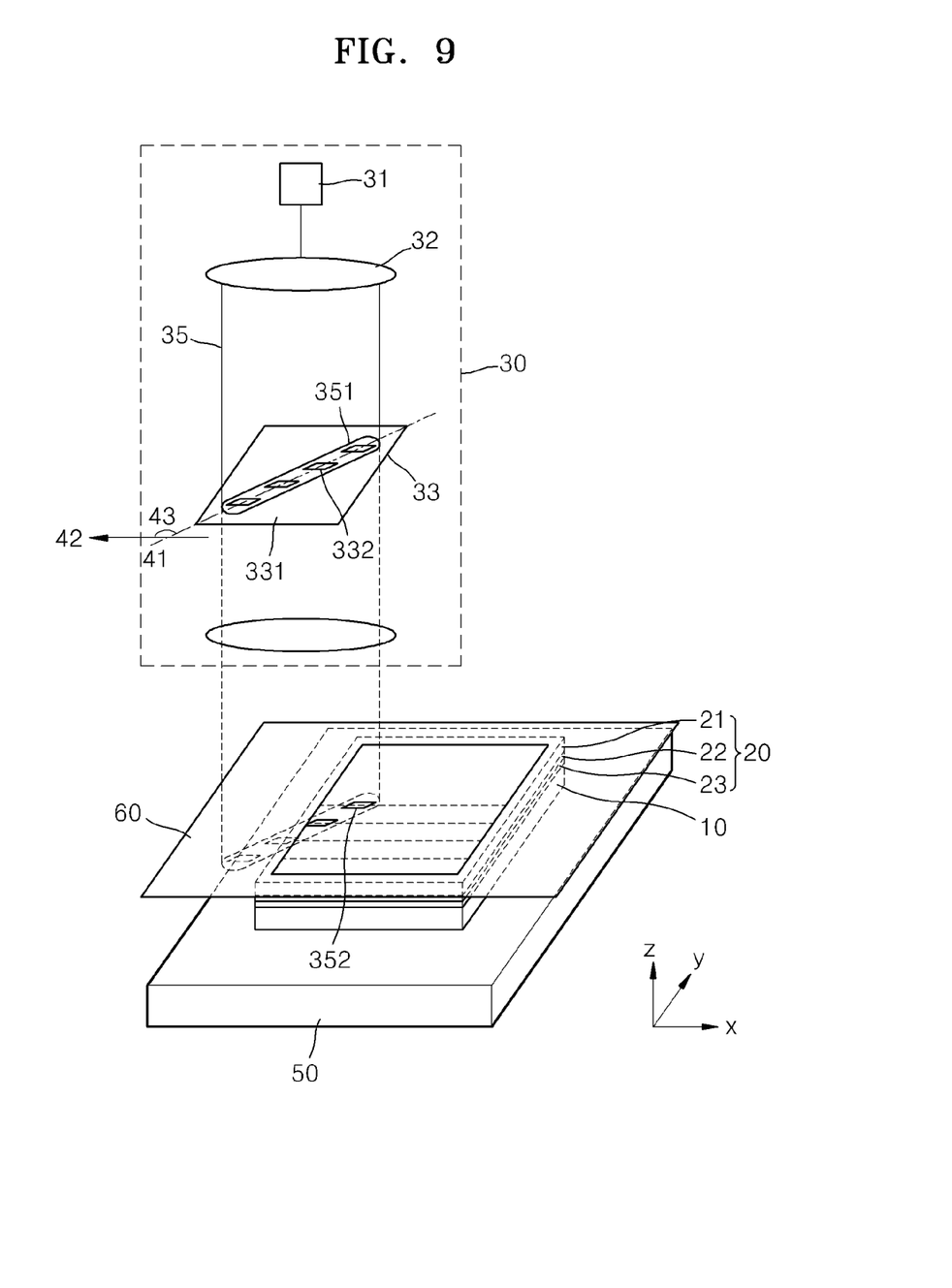
FIG. 9 is a view schematically illustrating a configuration of a laser-induced thermal imaging apparatus according to another embodiment of the present invention.
Figure 10:
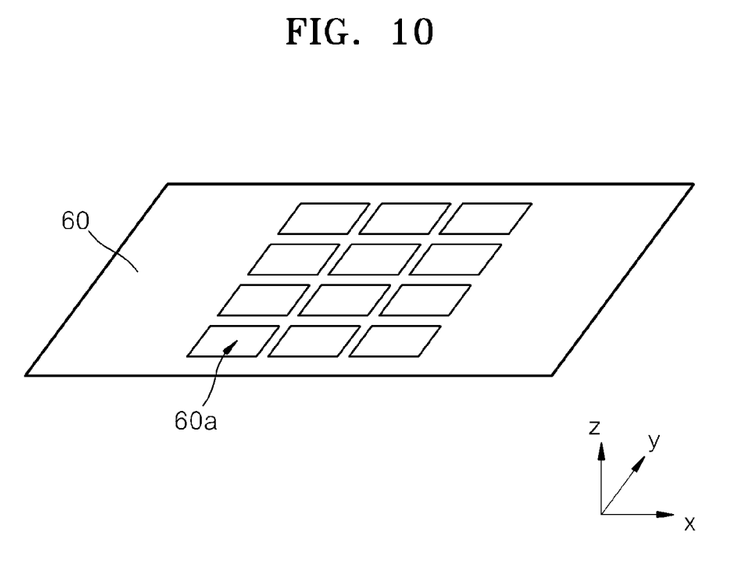
FIG. 10 is a planar view schematically illustrating a part of a laser-induced thermal imaging apparatus according to another embodiment of the present invention.

FIG. 9 is a view schematically illustrating a configuration of a laser-induced thermal imaging apparatus according to another embodiment of the present invention, and FIG. 10 is a planar view schematically illustrating a part of a laser-induced thermal imaging apparatus according to another embodiment of the present invention. The laser-induced thermal imaging apparatus according to the present embodiment of the present invention is different from laser-induced thermal imaging apparatuses according to the above-described embodiments in that the laser-induced thermal imaging apparatus according to the present embodiment of the present invention does not include a shield unit, but includes a second mask 60.

As described above, the edge part of the substrate 10 is not an active area (i.e., the display area), and various components, such as a controller, may be arranged on the edge part, etc. In the case of the laser-induced thermal imaging apparatus according to an embodiment of the present invention, the second mask 60, which may be arranged on the path of the laser beam 35 irradiated from the laser beam irradiation unit 30, has a transmission unit corresponding to the active area of the substrate 10 arranged on the substrate support unit 50, which means that the second mask 60 blocks the laser beam irradiated on a portion other than the active area of the substrate 10.

Likewise, the irradiation of the laser beam on the unnecessary portion of the laser-induced thermal imaging apparatus may cause problems, such as damage or a lifespan reduction of the laser-induced thermal imaging apparatus. Furthermore, the transfer layer 23 may not be transferred from the donor film 20 to the edge part of the substrate, which is not the active area (i.e., the display area) of the substrate 10.

In the laser-induced thermal imaging apparatus according to the present embodiment of the present invention, the second mask 60 exists, and thus the irradiation of the laser beam on an unnecessary portion of the laser-induced thermal imaging apparatus or the transfer of the transfer layer 23 of the donor film 20 onto an unnecessary portion of the substrate 10 may be effectively prevented.

The second mask 60 may contain, for example, a metal to block the laser beam. For example, Invar may be contained to minimize thermal deformation. Furthermore, the second mask 60 may have a structure of a glass material coated by chrome on the part where the laser beam is blocked.

Furthermore, one display apparatus may be manufactured by one substrate 10 using a configuration illustrated in FIG. 9, but a plurality of display apparatuses may also be formed on one substrate 10, and the one substrate 10 may be cut so as to simultaneously manufacture a plurality of display apparatuses. In this case, it may be necessary to set the transfer layer 23 of the donor film 20 not to be transferred to the edge of respective display apparatuses.

Hence, when the active area of a substrate arranged on a substrate support unit includes a plurality of separately spaced areas, the transmission unit of the second mask 60 may be set to include a plurality of separately spaced transmission areas 60a corresponding to the plurality of areas included in the active area of the substrate arranged on the substrate support unit, as illustrated in FIG. 10.

Figure 11:
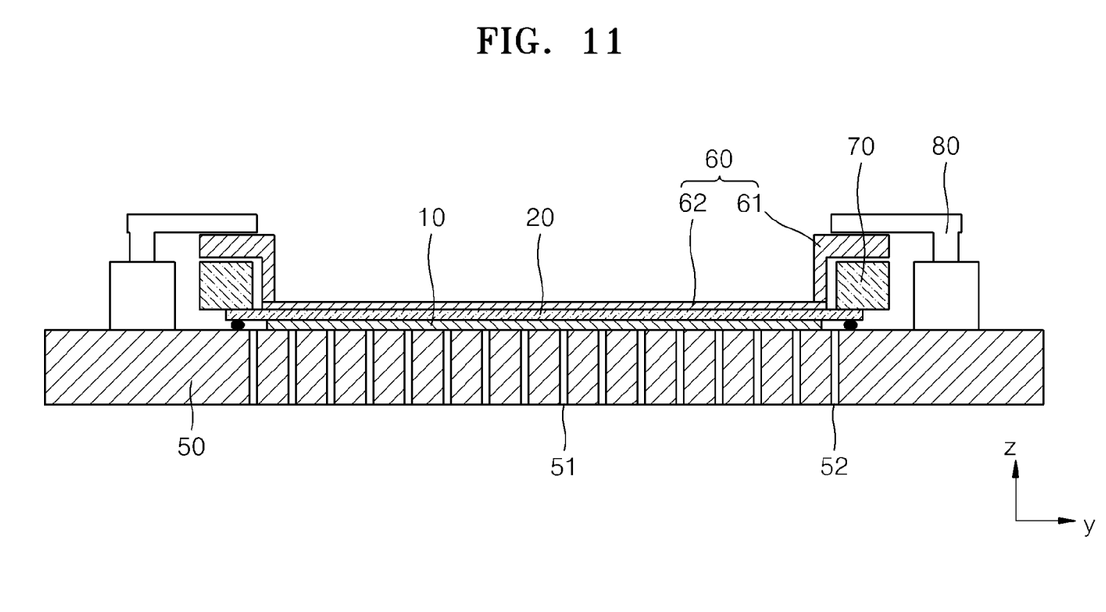
FIG. 11 is a cross-sectional view schematically illustrating a configuration of a laser-induced thermal imaging apparatus according to another embodiment of the present invention.

FIG. 11 is a cross-sectional view schematically illustrating a configuration of a laser-induced thermal imaging apparatus according to another embodiment of the present invention.

The substrate support unit 50 may include a substrate adsorption vacuum hole 51 for fixing a substrate 10, and a film adsorption vacuum hole 52 for sticking the donor film 20 fast to the substrate and fixing the donor film 20. Here, sticking the donor film 20 fast to the substrate 10 may be understood as sticking the donor film 20 fast, not to the substrate 10 itself, but to a structure that has already been formed on the substrate 10.

The donor film 20 is fixed by being stuck fast to the substrate 10 by the film absorption vacuum hole 52, and in order to prevent the movement of the donor film 20, the edge of the donor film 20 may be pushed and fixed by a film-fixing frame 70. In such a state, the second mask 60 may be located adjacent to the donor film 20 before the irradiation of the laser beam.

The second mask 60 may include a frame 61 and a sheet 62 welded to the frame 61. Here, the sheet 62 may include a transmission unit including a plurality of separately spaced transmission areas 60a to correspond to a plurality of areas included in the active area of the substrate 10 arranged on the substrate support unit 50 as illustrated in FIG. 10. The frame 61 of the second mask 60 may be located on the film-fixing frame 70, and the location may be fixed by being pushed by a clamp 80. Furthermore, before the frame 61 of the second mask 60 is pushed by the clamp 80, the location of the second mask 60 may be adjusted and aligned with respect to the substrate 10. To this end, the vision alignment may be set to be possible through an observation unit including an imaging device, etc. by providing an opening corresponding to an aligning mark that has been formed on the substrate.

The description has focused on the laser-induced thermal imaging apparatus, but the present invention is not limited thereto, and the laser-induced thermal imaging apparatus is also included in the scope of the present invention.

That is, with respect to a laser-induced thermal imaging method according to an embodiment of the present invention, a donor film may be disposed on a substrate after the substrate is disposed on a substrate support unit. Furthermore, the substrate and the donor film may be disposed on the substrate support unit after placing the donor film on the substrate.

Thereafter, the linear laser beam may pass through a first mask including a plurality of openings arranged along the length direction of the laser beam so as to be irradiated on the donor film, and the substrate may be set to be scanned in one direction that is not perpendicular to the length direction of the laser beam so as to transfer a transfer layer of the donor film to the substrate in a linear pattern extended in the one direction. Furthermore, the irradiation operation and the transfer operation may be performed substantially at the same time.

Here, the transfer operation may expose all of the plurality of openings of the first mask or may shield at least one of the plurality of openings. As such, the irradiation of the laser beam on an unnecessary portion of the laser-induced thermal imaging apparatus or the transfer of the transfer layer of the donor film on an unnecessary portion of the substrate may be effectively prevented.

The transfer operation may gradually expose or shield the plurality of openings of the first mask. Specifically, the transfer operation may include gradually exposing the plurality of openings of the first mask with a first shield plate for the transfer, and gradually shielding the plurality of openings of the first mask with a second shield plate after all predetermined openings have been exposed among the plurality of openings of the first mask for the transfer. Here, gradually shielding the plurality of openings of the first mask may include shielding a first opening among the plurality of the openings of the first mask, and then shielding a second opening among the plurality of the openings of the first mask, while the first opening is exposed by the first shield plate and then the second opening is exposed by the first shield plate.

In the case of a laser-induced thermal imaging method according to another embodiment of the present invention, first, a substrate having an active area may be disposed on a substrate support unit, and then a donor film may be disposed on the substrate. Furthermore, the donor film may be first disposed on the substrate, and then the substrate and the donor film may be disposed on the substrate support unit.

Thereafter, the linear laser beam may pass through the first mask including a plurality of openings arranged along the length direction of the laser beam, and then the laser beam may pass through the second mask including a transmission unit for exposing the active area of the substrate so as to be irradiated on the donor film, and the substrate may be scanned in one direction that is not perpendicular to the length direction of the laser beam by the laser beam so as to transfer the transfer layer of the donor film on the substrate in a linear pattern extended in the one direction. Furthermore, the irradiation operation and the transfer operation may proceed substantially at the same time. Likewise, the laser beam may be set to be irradiated on the donor film after passing through the second mask having the transmission unit for exposing the active area of the substrate, and thus the irradiation of the laser beam on an unnecessary portion of the laser-induced thermal imaging apparatus or the transfer of the transfer layer of the donor film on an unnecessary portion of the substrate may be effectively prevented.

Until now, the laser-induced thermal imaging method has been described, but the present invention is not limited thereto, and a method of manufacturing an organic light-emitting display apparatus using such a laser-induced thermal imaging method is also within the scope of the present invention. That is, an organic film, which is interposed between a pixel electrode and a counter electrode of an organic light-emitting device, may be formed using one of the above-described laser-induced thermal imaging methods Likewise, according to the present invention, a laser-induced thermal imaging apparatus and method, and a method of manufacturing an organic light-emitting display apparatus using the method, which may reduce transfer defects, may be implemented While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method of manufacturing an organic light-emitting display apparatus, comprising the steps of:
    positioning a substrate on a substrate support unit;
    positioning a donor film on the substrate;
    irradiating a linear laser beam onto the donor film after the linear laser beam passes through a first mask including a plurality of openings arranged along a length direction of the linear laser beam; and
    transferring a transfer layer of the donor film onto the substrate in a linear pattern extended in one direction that is not perpendicular to the length direction of the linear laser beam by scanning the substrate with the linear laser beam in the one direction that is not perpendicular to the length direction of the linear laser beam;

wherein the transferring step includes shielding at least some of the plurality of openings of the first mask from the linear laser beam.

2. The method of claim 1, wherein the transferring step performs one of gradually exposing and shielding the plurality of openings of the first mask.

3. The method of claim 1, wherein the transferring step comprises:
gradually exposing the plurality of openings of the first mask with a first shield plate for the transfer; and
gradually shielding the plurality of openings of the first mask with a second shield plate after exposing predetermined openings among the plurality of openings of the first mask.

4. The method of claim 3, wherein a first opening among the plurality of openings of the first mask is exposed by the first shield plate and then a second opening among the plurality of openings of the first mask is exposed by the first shield plate, and the first opening is shielded by the second shield plate and then the second opening is shielded by the second shield plate.

5. The method of claim 1, wherein the transferring step performs one of gradually exposing and shielding the plurality of openings of the first mask by moving a shield unit along the length direction of the linear laser beam.

6. The method of claim 1, wherein the transferring step performs one of gradually exposing and shielding the plurality of openings of the first mask by moving a shield unit along the length direction of the linear laser beam at a constant speed.

7. The method of claim 6, wherein the shield unit comprises a first shield plate and a second shield plate.

8. The method of claim 7, wherein when the substrate is scanned along the one direction from one edge to another edge by the linear laser beam, the first shield plate gradually exposes the plurality of openings of the first mask, and the second shield plate gradually shields the plurality of openings of the first mask after exposing all predetermined openings among the plurality of openings of the first mask.

9. The method of claim 8, wherein the second shield plate first shields a first opening among the plurality of openings of the first mask and then shields a second opening among the plurality of openings of the first mask while the first shield plate exposes the first opening and then exposes the second opening.

10. The method of claim 7, wherein the first shield plate and the second shield plate are mutually connected by a support unit.

11. The method of claim 10, wherein a distance between the first shield plate and the second shield plate is greater than a distance between openings located at both ends of predetermined openings among the plurality of openings of the first mask.

12. The method of claim 1, wherein the plurality of openings of the first mask are dot patterns.

13. The method of claim 1, wherein the plurality of openings of the first mask include a pair of first sides parallel to the one direction and a pair of second sides parallel to the length direction of the linear laser beam.

14. A method of manufacturing an organic light-emitting display apparatus, comprising the steps of:
transferring a substrate including an active area onto a substrate support unit;
positioning a donor film on the substrate;
irradiating a linear laser beam onto the donor film after the linear laser beam passes through a second mask, including a transmission unit corresponding to the active area of the substrate and a blocking unit outside the transmission unit, after passing through a first mask including a plurality of openings arranged along a length direction of the linear laser beam and passing through an optical system interposed between the first mask and the second mask; and
transferring a transfer layer of the donor film onto the substrate in a linear pattern extended in one direction that is not perpendicular to the length direction of the linear laser beam by scanning the substrate by the linear laser beam in the one direction.

15. The method of claim 14, wherein the active area of the substrate includes a plurality of separately spaced areas, and the transmission unit of the second mask includes a plurality of separately spaced transmission areas corresponding to the plurality of areas included in the active area of the substrate.

16. The method of claim 14, wherein the second mask is placed adjacent to the donor film if the donor film is placed adjacent to the substrate.

17. The method of claim 14, wherein the plurality of openings of the first mask are dot patterns.

18. The method of claim 14, wherein the plurality of openings of the first mask include a pair of first sides parallel to the one direction and a pair of second sides parallel to the length direction of the linear laser beam.

* * * * *